United States Patent
Lin

(10) Patent No.: US 6,413,801 B1
(45) Date of Patent: Jul. 2, 2002

(54) METHOD OF MOLDING SEMICONDUCTOR DEVICE AND MOLDING DIE FOR USE THEREIN

(75) Inventor: Chun Hung Lin, Kaohsiung (TW)

(73) Assignee: Advanced Semiconductor Engineering, Inc., Kaohshiung (TW)

(*) Notice: Subject to any disclaimer, the term of this patent is extended or adjusted under 35 U.S.C. 154(b) by 0 days.

(21) Appl. No.: 09/562,903

(22) Filed: May 2, 2000

(51) Int. Cl.[7] .......................... H01L 21/44; H01L 21/48; H01L 21/50
(52) U.S. Cl. ........................................ 438/127; 438/126
(58) Field of Search ................................ 438/106, 118, 438/124–127, FOR 367, FOR 372, FOR 374, FOR 384, 110, 109

(56) References Cited

U.S. PATENT DOCUMENTS

| | | | |
|---|---|---|---|
| 5,824,252 A | * 10/1998 | Miyajima | 264/272.17 |
| 5,998,243 A | * 12/1999 | Odashima et al. | 438/127 |
| 6,080,354 A | * 6/2000 | Miyajima | 264/511 |
| 6,081,978 A | * 7/2000 | Utsumi et al. | 29/25.01 |
| 6,114,189 A | * 9/2000 | Chia et al. | 438/112 |

FOREIGN PATENT DOCUMENTS

| | | | | |
|---|---|---|---|---|
| JP | 361078549 A | * 4/1986 | ............ | B22D/17/22 |
| JP | 411297731 A | * 10/1999 | ............ | H01L/21/56 |

\* cited by examiner

*Primary Examiner*—Wael Fahmy
*Assistant Examiner*—Brook Kebede

(57) ABSTRACT

A method of molding a semiconductor device comprising the steps of: (a) providing a molding die comprising a molding portion having a cavity for accepting the semiconductor device, a dummy cavity connected to the cavity and an air vent connected to the dummy cavity; (b) closing and clamping the molding die in a manner that the semiconductor chip is positioned in the cavity; (c) transferring a molding material into the cavity and the dummy cavity; (d) hardening the molding material; (e) unclamping and opening the molding die to take out the molded product. The molding method of the present invention is characterized in that even though the cavity with the semiconductor device positioned therein is filled, the transfer ram keeps moving such that the molding material is forced to continue flowing into the dummy cavity. This invention further provides a molding die for use in molding a semiconductor device. The molding die mainly comprises a pot for storing molding material, a molding portion and a runner. The molding portion has a cavity for accepting the semiconductor device, a dummy cavity connected to the cavity and an air vent connected to the dummy cavity. The runner has one end connected to the pot and the other end connected to the cavity through a gate. The channel for connecting the cavity to the dummy cavity has a size substantially the same as the size of the gate such that during molding, the molding material will fill the cavity through the runner and the gate, and then fill the dummy cavity through the channel.

2 Claims, 5 Drawing Sheets

METHOD OF MOLDING SEMICONDUCTOR DEVICE AND MOLDING DIE FOR USE THEREIN

BACKGROUND OF THE INVENTION

1. Field of the Invention

This invention relates to a method for producing a semiconductor device, and more specifically to a method of molding a semiconductor device. This invention also relates to a molding die for use in molding a semiconductor device.

2. Description of the Related Art

As electronic devices have become more smaller and thinner, the velocity and the complexity of IC chip become more and more higher. Accordingly, a need has arisen for higher package efficiency. Demand for miniaturization is the primary catalyst driving the usage of advanced packages such as chip scale packages (CSP) and flip chips. Both of them greatly reduce the amount of board real estate required when compared to the alternative ball grid array (BGA) and quad flat pack (QFP). Typically, a CSP is 20 percent larger than the die itself, while the flip chip has been described as the ultimate package precisely because it has no package. The bare die itself is attached to the substrate by means of solder bumps directly attached to the die.

FIG. 1 discloses a semiconductor chip 10 mounted to a substrate 20 using the flip chip technique described above. Since the coefficient of thermal expansion (CTE) of the semiconductor chip 10 and that of the substrate 20 are usually quite mismatched. Typically, the semiconductor chip has a CTE of about 3–5 parts per million per degree Celsius (ppm/°C.) while the CTE of a substrate is about 20–30 ppm/°C. Thus, an underfill 30 is preferably formed between the chip 10 and the substrate 20 for sealing the gap between the solder joints 12. The underfill 30 provides stress relief in the solder joints 12 due to CTE mismatch between chip and substrate.

Underfill material is typically laid down along the edge surface of the chip 10 by using an automated underfill dispense system; then, the underfill material is pulled under the chip 10 by capillary action. However, such a method has a disadvantage that it takes time to form the underfill by filling the underfill material into the gap between the chip 10 and the substrate 20 along the edge surface of the chip 10.

Therefore, the semiconductor industry develops a method of forming a package body sealing the gap between the chip and the substrate by transfer molding. FIG. 2 shows a conventional transfer molding die comprising two cavities respectively installed with a chip mounted on a substrates by flip-chip bonding. As shown in the FIG. 2, the molding die is provided with a pot 40 for storing molding material. The pot 40 is connected to a cavity 46 through a runner 42 and a gate 44. After the semiconductor device is positioned in the cavity 46 of the molding die, the molding material is positioned in the pot 40, and the molding die is closed and clamped. Then a transfer ram 48 is moved (up in FIG. 2) to compress the molding material such that the liquefied molding material is forced through the runner 42 and the gate 44 to fill the cavity 46 for sealing the gap between the chip 10 and the substrate 20. However, since the gap between the chip 10 and the substrate 20 is very small (typically 0.05~1 mm), air is prone to be entrapped therein with no where to escape, thus leaving a void 32. This will cause reliability problem in the mechanical and electrical interconnections (i.e., the solder joints 12) between the chip 10 and the substrate 20.

U.S. Pat. No. 5,998,243 discloses another method for molding a semiconductor device in which the mold cavity is maintained under high vacuum (about 10 torr or below) thereby significantly suppressing the formation of voids between the chip and the substrate after encapsulation. Referring to FIG. 3, the molding die according to a preferred embodiment disclosed in U.S. Pat. No. 5,998,243 is provided with a vacuum pump (not shown) for exhausting the cavity 46 to reduce the pressure thereof through an exhaust vent 50. Typically, the channel 54 for connecting the cavity 46 to the exhaust vent 50 has a size smaller than the average diameter of filler particles in the molding material thereby preventing the molding material from entering the exhaust vent 50. However, such a method for molding a semiconductor device has a disadvantage that it is not easy to ensure proper and effective maintenance of the vacuum pump. Further, vacuum pump significantly increases the cost of this mold die.

SUMMARY OF THE INVENTION

It is a primary object of the present invention to provide a method of molding a semiconductor device which is capable of solving the above-mentioned void problem of prior art and forming a package body sealing the gap between the chip and the substrate in a short time.

It is another object of the present invention to provide a molding die for use in molding semiconductor device which is capable of forming a package body sealing the gap between the chip and the substrate in a short time as well as suppressing the formation of voids.

Accordingly, in a first aspect, the present invention provides a method of molding a semiconductor device comprising the steps of: (a) providing a molding die comprising a molding portion having a cavity for accepting the semiconductor device, a dummy cavity connected to the cavity and an air vent connected to the dummy cavity; (b) closing and clamping the molding die in a manner that the semiconductor chip is positioned in the cavity; (c) transferring a molding material into the cavity and the dummy cavity; (d) hardening the molding material; (e) unclamping and opening the molding die to take out the molded product. The molding method of the present invention is characterized in that even though the cavity with the semiconductor device positioned therein is filled, the transfer ram keeps moving such that the molding material is forced to continue flowing into the dummy cavity. Therefore, air supposed to be entrapped between the chip and the substrate will be squeezed out along with the molding flow into the dummy cavity such that the occurrence of voids in the cavity can be significantly reduced.

According to a second aspect, this invention further provides a molding die for use in molding a semiconductor device. The molding die mainly comprises a pot for storing molding material, a molding portion and a runner. The molding portion has a cavity for accepting the semiconductor device, a dummy cavity connected to the cavity and an air vent connected to the dummy cavity. The runner has one end connected to the pot and the other end connected to the cavity through a gate. The channel for connecting the cavity to the dummy cavity has a size substantially the same as the size of the gate such that during molding, the molding material will fill the cavity through the runner and the gate, and then fill the dummy cavity through the channel.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
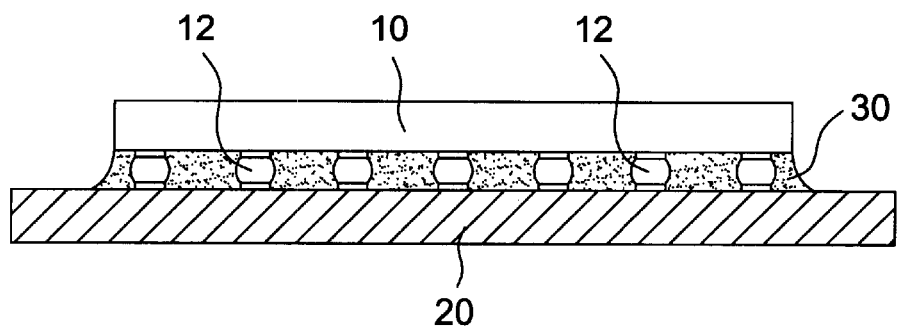
FIG. 1 is a schematic sectional view of a conventional flip chip package.
Figure 2:
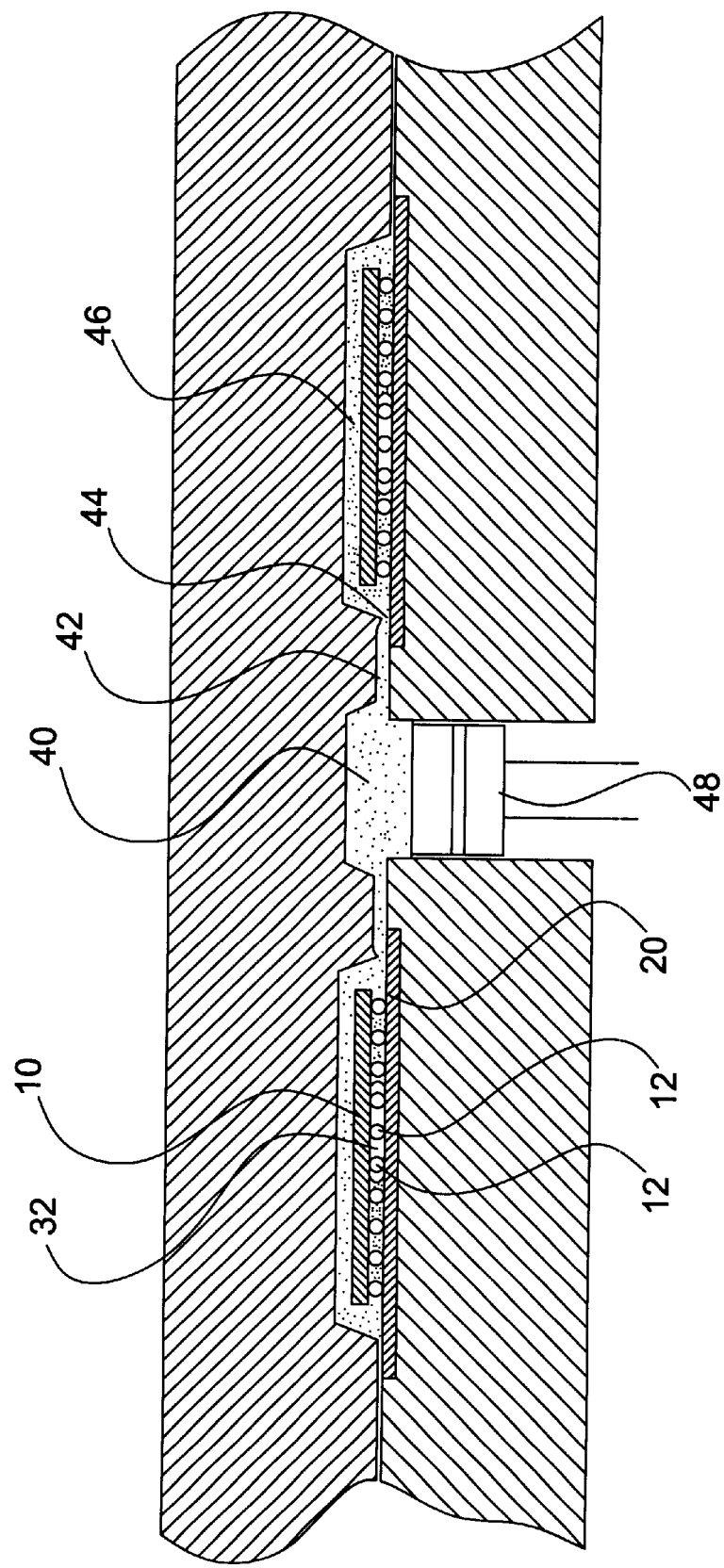
FIG. 2 is a schematic sectional view of a conventional transfer molding die comprising two cavities respectively installed with a chip mounted on a substrates by flip-chip bonding.
Figure 3:
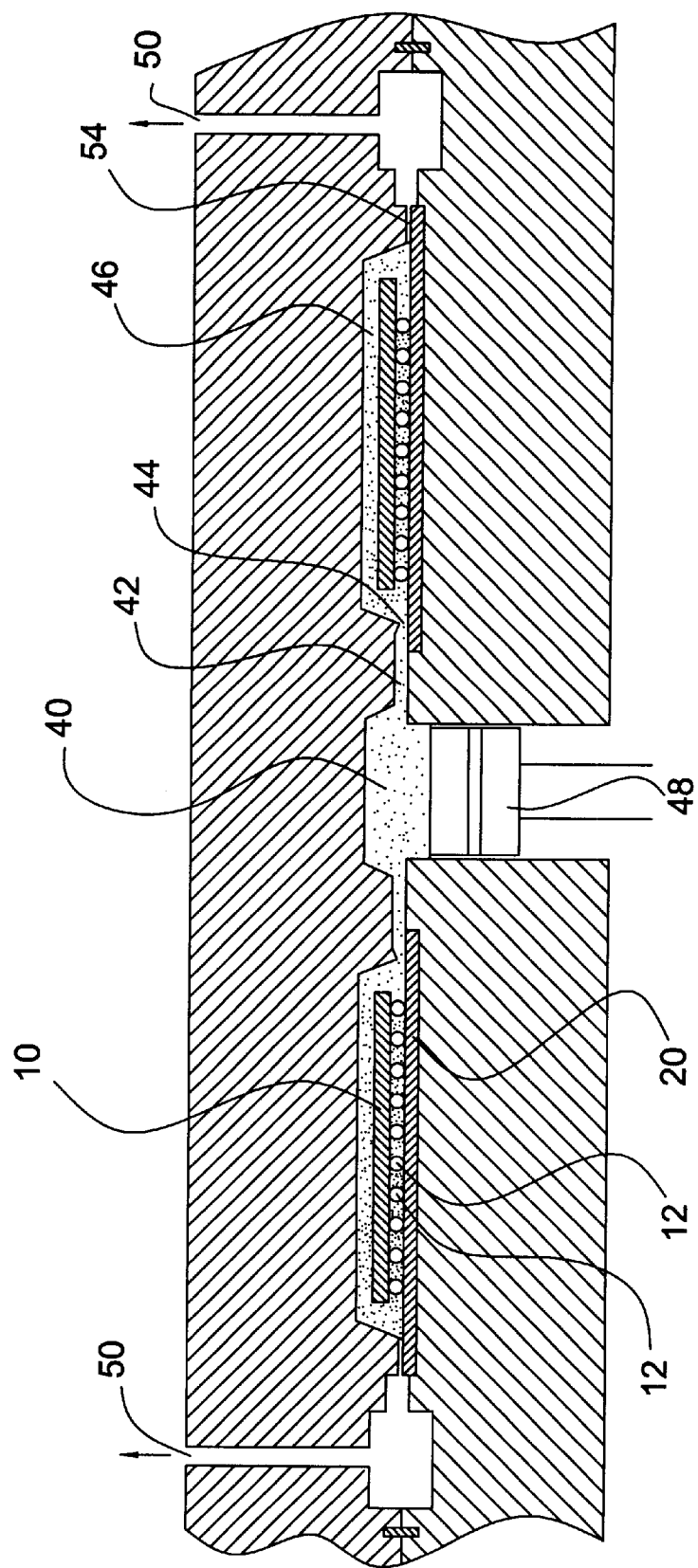
FIG. 3 is a schematic sectional view of a molding die according to a preferred embodiment disclosed in U.S. Pat. No. 5,998,243 wherein the molding die comprises two cavities respectively installed with a chip mounted on a substrates by flip-chip bonding.
Figure 4:
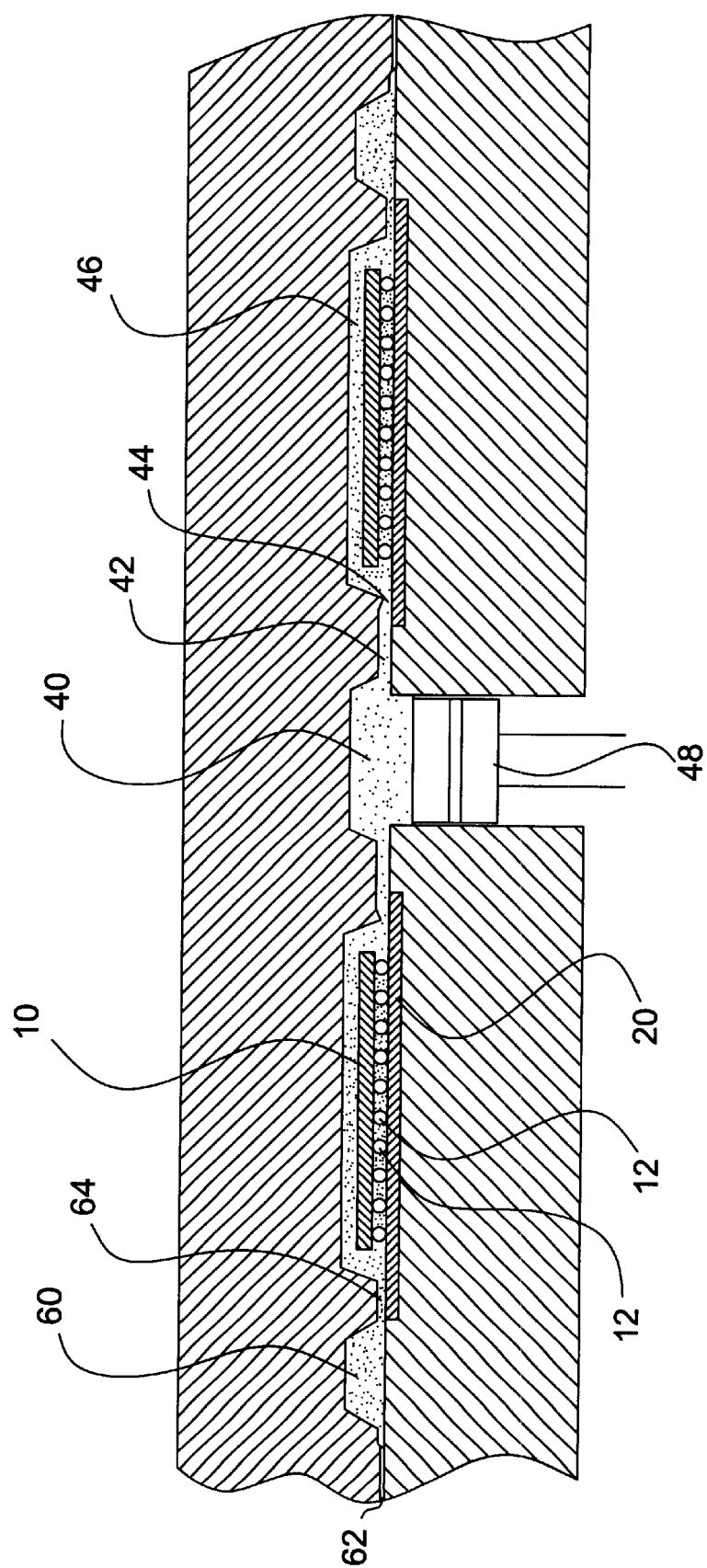
FIG. 4 is a schematic sectional view of a molding die according to a first preferred embodiment of the present invention wherein the molding die comprises two cavities respectively installed with a chip mounted on a substrates by flip-chip bonding.

FIG. 4 discloses a molding die according to a first preferred embodiment of the present invention. The molding die is provided with a pot 40 for storing molding material. The pot 40 is connected to a cavity 46 through a runner 42 and a gate 44. The molding die according to the first preferred embodiment is provided with a dummy cavity 60 connected to the cavity 46 and an air vent 62 connected to the dummy cavity 60.

Referring to FIG. 4, each of the cavities 46 is installed with a chip 10 mounted to a substrate 20 by flip-chip bonding. The cavity 46 is shaped generally to conform to the to-be-molded shape of finished flip chip package. After the semiconductor device is positioned in the cavity 46, the molding material is positioned in the pot 40, and the molding die is closed and clamped. Then the transfer ram 48 is moved (up in FIG. 4) to compress the molding material. The molding die and the molding material are pre-heated so that when the transfer ram 48 compresses the molding material, the liquefied molding material is forced through the runner 42 and the gate 44 to fill the cavity 46 for encapsulating the semiconductor chip 10 and sealing the gap between the chip 10 and the substrate 20. After the molding material fills the cavity 46, the transfer ram 48 keeps moving so that the molding material is forced to continue flowing into the dummy cavity 60. Therefore, air supposed to be entrapped between the chip 10 and the substrate 20 will be squeezed out along with the molding flow into the dummy cavity 60 such that air is forced out of the cavity 46 to avoid forming voids therein. Preferably, each of the dummy cavities 60 is interconnected to one another thereby balancing the pressure of molding compound inside the cavities and the dummy cavities. After the molding material fills the cavity 46 as well as the dummy cavity 60, the transfer ram 48 stands still for a predetermined time until the molding material cures. Then the transfer ram 48 is withdrawn, the molding die is opened, and the molded products are removed from the molding die.

However, the molding material not only fills the cavities but also fills the gates 44, the runners 42 and the pots 40. Therefore, when the molding material is cured, the cured molding material not only covers the semiconductor chips, but also extends along the surface of the substrate 20, where the gates 44 and the runners 42 are located, and into the pots 40. This excess cured molding material is often referred to as the "runner" and must be removed before the molded products are singulated. Accordingly, the gate 44 is generally made smaller in cross-sectional area than the runner 42 in order to assist in the "degating" process, i.e., the removal of the excess molding material. Moreover, since the dummy cavities 60 are also filled with the molding material. Therefore, during the removal of the runners and gates of the molded product, the molded piece formed in the dummy cavity also can be removed at the same time, and then the molded product is cut into individual units, whereby the flip chip package is completed.

Figure 5:
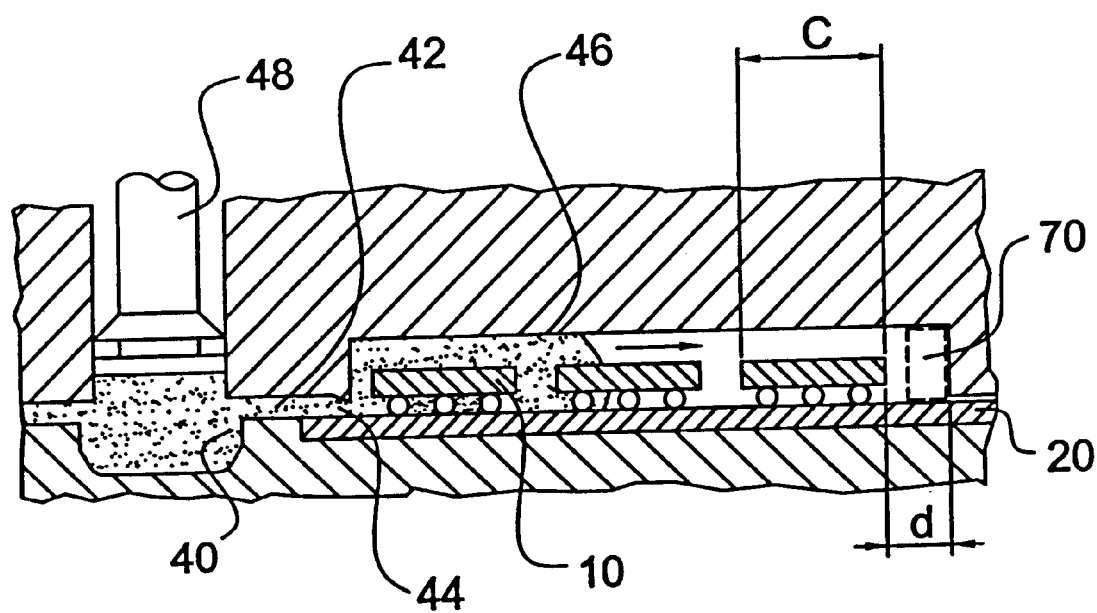
FIG. 5 is a cross sectional view of a molding die according to a second preferred embodiment of the present invention wherein the molding die comprises a cavity installed with a plurality of chips mounted on a substrates by flip-chip bonding.

FIG. 5 discloses a molding die according to a second preferred embodiment of the present invention. The molding die is provided with a pot 40 that is connected to a cavity 46 through a runner 42 and a gate 44. The cavity 46 is installed with a plurality of chips 10 mounted to a substrate 20 by flip-chip bonding. The molding die according to a second preferred embodiment of the present invention is characterized in that the minimum spacing (defined as "d" shown in FIG. 5) between the side wall of the cavity 46 and the farthest semiconductor chip from the gate 44 at least equals half of the measured distance (defined as "C" shown in FIG. 5) of the chip's side parallel with the direction of molding flow (as indicated by the arrow shown in FIG. 5). After the semiconductor device is positioned in the cavity 46 of the molding die, the molding material is positioned in the pot 40, and the molding die is closed and clamped. Then a transfer ram 48 is moved (down in FIG. 5) to compress the molding material such that the liquefied molding material is forced through the runner 42 and the gate 44 to fill the cavity 46 for encapsulating the semiconductor chips 10 and sealing the gap between the chips 10 and the substrate 20. After the molding material covers the farthest semiconductor chip from the gate 44, the transfer ram 48 keeps moving down so that the molding material is forced to continue flowing into an extra space 70 especially created between the farthest chip and the side wall of the cavity 46. Therefore, air supposed to be entrapped between the chips 10 and the substrate 20 will be squeezed out along with the molding flow into the extra space 70. Preferably, each of the cavities 46 defined in the molding die is interconnected to one another thereby balancing the pressure of molding compound inside the cavities 46. After the molding material fills the cavity 46, the transfer ram 48 stands still for a predetermined time until the molding material cures. Then the transfer ram 48 is withdrawn, the molding die is opened, and the molded products are removed from the molding die. After that, the runners and gates of the molded product are removed, and then the molded product is cut into individual units, whereby the flip chip package is completed.

As noted above, the method of molding a semiconductor device in accordance with the present invention is capable of forming a package body sealing the gap between the chip and the substrate in a short time as well as avoiding the formation of voids therein. The present invention further provides a molding die for use in molding a semiconductor device which is capable of forming a package body sealing the gap between the chip and the substrate in a short time as well as suppressing the formation of voids. Although the preferred embodiments in the present invention are explained by means of flip chip packages, it is specifically contemplated that the present invention is widely applicable to various semiconductor devices using transfer molding, including, but not limited to, BGA packages, TSOP, and chip array package.

Although the invention has been explained in relation to its preferred embodiment, it is to be understood that many other possible modifications and variations can be made without departing from the spirit and scope of the invention as hereinafter claimed.

What is claimed is:

1. A method of molding a semiconductor device comprising a substrate supporting a plurality of semiconductor chips electrically connected to the substrate, the molding method comprising the steps of:

providing a molding material;

providing a molding die having a pot for storing molding material, a molding portion with a cavity for accepting the semiconductor device, and an air vent connected to the cavity and formed so as to prevent overflowing of the molding material therethrough; a gate; and a runner having one end connected to the pot and the other end connected to the cavity through the gate, the cavity defined by a base and a side wall extending from the base;

closing and clamping the molding die with the semiconductor chips are positioned in the cavity so as to maintain the side wall of the cavity at a distance from a semiconductor chip farthest from the gate at least equal to half of a longitudinal dimension of the farthest semiconductor chip, whereby a space is defined between the farthest chip and the side wall of the cavity based on the distance;

feeding the molding material into the cavity such that the molding material flows into the cavity and then into the space through the channel whereby air in the cavity is vented out through the space and the air vent while preventing overflowing of the molding material through the air vent;

hardening the molding material; and unclamping and opening the molding die to take out the molded product.

2. The method as claimed in claim 1, wherein the molding portion further has a plurality of interconnecting cavities.

\* \* \* \* \*